United States Patent
Zhou et al.

(10) Patent No.: US 8,598,576 B2
(45) Date of Patent: Dec. 3, 2013

(54) MAGNETIC RANDOM ACCESS MEMORY WITH FIELD COMPENSATING LAYER AND MULTI-LEVEL CELL

(75) Inventors: Yuchen Zhou, San Jose, CA (US); Yiming Huai, Pleasanton, CA (US); Rajiv Yadav Ranjan, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 311 days.

(21) Appl. No.: 13/029,054

(22) Filed: Feb. 16, 2011

(65) Prior Publication Data

US 2012/0205760 A1 Aug. 16, 2012

(51) Int. Cl.
H01L 29/82 (2006.01)
H01L 21/8246 (2006.01)

(52) U.S. Cl.
USPC .................................. 257/42; 438/3

(58) Field of Classification Search
CPC ............................ H01L 29/82; H01L 21/8246
USPC ................ 257/421, E21.665, E29.323; 438/3
See application file for complete search history.

(56) References Cited

U.S. PATENT DOCUMENTS

| | | | | |
|---|---|---|---|---|
| 8,357,982 B2 * | 1/2013 | Kajiyama | | 257/421 |
| 2005/0185455 A1 * | 8/2005 | Huai | | 365/171 |
| 2010/0096716 A1 * | 4/2010 | Ranjan et al. | | 257/421 |
| 2011/0031569 A1 * | 2/2011 | Watts et al. | | 257/421 |
| 2012/0163070 A1 * | 6/2012 | Nagase et al. | | 365/158 |

* cited by examiner

*Primary Examiner* — Walter H Swanson
(74) *Attorney, Agent, or Firm* — Maryam Imam; IPxLAW GROUP LLP

(57) ABSTRACT

A spin toque transfer magnetic random access memory (STT-MRAM) element comprises a reference layer, formed on a substrate, with a fixed perpendicular magnetic component. A junction layer is formed on top of the reference layer and a free layer is formed on top of the junction layer with a perpendicular magnetic orientation, at substantially its center of the free layer and switchable. A spacer layer is formed on top of the free layer and a fixed layer is formed on top of the spacer layer, the fixed layer has a fixed perpendicular magnetic component opposite to that of the reference layer. The magnetic orientation of the free layer switches relative to that of the fixed layer. The perpendicular magnetic components of the fixed layer and the reference layer substantially cancel each other and the free layer has an in-plane edge magnetization field.

9 Claims, 11 Drawing Sheets

MAGNETIC RANDOM ACCESS MEMORY WITH FIELD COMPENSATING LAYER AND MULTI-LEVEL CELL

BACKGROUND OF THE INVENTION

1. Field of the Invention

The present invention relates generally to magnetic memory elements having magnetic tunnel junctions (MTJ) and particularly to improving the ease of switching of the free layer of the MTJ to reduce the requisite voltage and current for causing the free layer to switch magnetic states.

2. Description of the Prior Art

Magnetic random access memory (MRAM) is rapidly gaining popularity as its use in replacing conventional memory is showing promise. Magnetic tunnel junctions (MTJs), which are essentially the part of the MRAM that store information, include various layers that determine the magnetic behavior of the device. An exemplary MTJ uses spin torque transfer to effectuate a change in the direction of magnetization of one or more free layers in the MTJ. That is, writing bits of information is achieved by using a spin polarized current flowing through the MTJ, instead of using a magnetic field, to change states or program/write/erase/read bits.

In spin torque transfer (STT) MTJ designs, when electrons flow across the MTJ stack in a direction that is perpendicular to the film plane or from the pinned (sometimes referred to as "reference" or "fixed") layer to the free (or storage) layer, spin torque from electrons transmitted from the pinned layer to the free layer orientate the free layer magnetization in a direction that is parallel to that of the reference or pinned layer. When electrons flow from the free layer to the pinned layer, spin torque from electrons that are reflected from the pinned layer back into the free layer orientate the free layer magnetization to be anti-parallel relative to the magnetization of the pinned layer. Thus, controlling the electron (current) flow direction, direction of magnetization of the free layer magnetization is switched. Resistance across the MTJ stack changes between low and high states when the free layer magnetization is parallel or anti-parallel relative to that of the pinned layer.

However, a problem that is consistently experienced and that prevents advancement of the use of MTJs is the threshold voltage or current used to switch the free layer magnetization during a write. Such current and threshold voltage requirements are currently too high to allow practical applications of the spin torque transfer based MTJ.

MTJs with perpendicular anisotropy, such that the magnetic moment of the free layer and the fixed layer thereof are in a perpendicular direction relative to the plane of the film, are more appealing than their in-plane anisotropy counterparts largely due to the density improvements realized by the former. Existing perpendicular MTJ designs include a free layer whose magnetic orientation relative to a reference ("fixed") layer, while perpendicular in direction, high coercivity field (Hc) of the free layer, at its edges, limits the reduction of the effective Hc of the free layer. Lower effective Hc of the free layer would allow easier switching of the free layer and would lower the threshold voltage and current required to switch the magnetization of the free layer.

It is noted that the foregoing problem occurs due to the inconsistent Hc throughout the free layer, as shown and discussed by way of a graph shortly. That is, perpendicular anisotropic field (Hk) of the free layer changes relative to the position within the free layer such that the center of the free layer generally has a lower Hc than the outer edges of the free layer with Hc essentially increasing from the center of the free layer to its outer edges. Accordingly, efforts to lower the perpendicular anisotropic field (Hk) of the free layer in order to ease switching result in lowering of effective Hc, undesirably increase the edge-to-center effective coercivity (Hc) ratio. The relationship between Hk and Hc are as follows:

$$Hc = Hk - Hdemag \qquad \text{Eq. (1)}$$

where Hdemag is the demagnetization field related to the magnetic moment, thickness, shape and size of the magnetic thin film For a greater understanding of the foregoing problem, FIGS. 1-3 show a relevant portion of a prior art magnetic memory element and a graph of its effective coercivity field performance.

FIG. 1 shows the relevant portion of a prior art magnetic random access memory (MRAM) element 10, which includes a reference layer 3, also known as a fixed layer, a barrier layer 2, also known as a tunnel layer, and a free layer 1. This configuration is common and very well known in the art. The layers 1-3 are often times collectively referred to as a magneto-tunnel junction (MTJ). When an electron current is applied through the layer 3 towards layer 1, for example during a write operation, the MRAM element 10 switches states where the magnetic moment of the layer 1 changes direction relative to the magnetic moment of the layer 3, from a direction shown by the arrow 5 to a direction shown by the arrow 6. Such a change in the layer 1 is also known as a change from an anti-parallel state, where the direction of the magnetic moment of the layer 1 is opposed to that of the layer 3 to a parallel state, where the direction of the magnetic moment of the layer 1 is in the same direction to that of the layer 3. The resistance of the MRAM element 10 changes according to its state and typically, such resistance is higher when the MRAM is in an anti-parallel state than when it is in a parallel state.

Lowering the perpendicular Hk of the layer 1 would make switching of the state of the MRAM 10 easier, however, as earlier noted, the effective Hc reduction, which would significantly ease switching of the state of the element 10 is limited because of the high Hc present at the edges of the layer 1. This is better noticed by the figures to follow.

FIG. 2 shows generally a top view 7 of the layer 1 of FIG. 2 and a side view 8 of the layer 1 of FIG. 2. The layer 1 is shown to be 65 nano meters in diameter, by way of example, and 1.2 nano meters in thickness. In accordance with these measurements, the effective Hc, in kilo Orsteds, vs. the position along the diameter of the layer 1, in nano meters (nm), is shown in a graph in FIG. 3. Accordingly, FIG. 3 shows a graph of the effective Hc, represented by the y-axis, vs. the position along the diameter of the layer 1, represented by the x-axis, for the case where the perpendicular Hk (p-Hk) is equal to 14.5 kilo Oersted (kOe), shown by the line 9 and for the case where the perpendicular Hk of the layer 1 is equal to 13 kOe, shown by the line 11. As shown, the effective Hc increases going from the center of the layer 1 out to its edge and this change gradually increase and at the far edge of the layer 1. When decreasing the perpendicular Hk from 14.5 kOe to 13 kOe, the edge-to-center effective Hc ratio is undesirably increased from 1.6 to 3.0.

Thus, the need arises for decreasing the perpendicular anisotropic field of the free layer of an MRAM yet avoiding a substantial increase in the effective Hc of the MRAM in order to reduce the threshold voltage and current required to operate the MRAM.

SUMMARY OF THE INVENTION

Briefly, a spin toque transfer magnetic random access memory (STTMRAM) element is disclosed for storing a state when electrical current is applied to it. The STTMRAM element includes a reference layer, formed on a substrate, having a perpendicular magnetic component associated therewith that is fixed in one direction. A junction layer is formed on top of the reference layer and a free layer is formed on top of the junction layer and has a magnetic orientation, at substantially the center of it that is perpendicular relative to the substrate and parallel and switchable relative to the reference layer. Further, a spacer layer is formed on top of the free layer and a fixed layer is formed on top of the spacer layer, the fixed layer having a perpendicular magnetic component associated therewith that is fixed in a direction opposite to that of the reference layer. The free layer is capable of switching its magnetic orientation relative to the fixed layer when electrical current is applied to the STTMRAM element. The perpendicular magnetic components of the fixed layer and the reference layer substantially cancel each other and the free layer has a magnetization field at its edge that is in-plane relative to the substrate.

These and other objects and advantages of the present invention will no doubt become apparent to those skilled in the art after having read the following detailed description of the various embodiments illustrated in the several figures of the drawing.

IN THE DRAWINGS

FIG. 1 shows the relevant portion of a prior art magnetic random access memory (MRAM) element 10, which includes a reference layer 3, also known as a fixed layer, a barrier layer 2, also known as a tunnel layer, and a free layer 1.

FIG. 2 shows generally a top view 7 of the layer 1 of FIG. 2 and a side view 8 of the layer 1 of FIG. 2.

FIG. 3 shows a graph of the effective Hc, represented by the y-axis, vs. the position along the diameter of the layer 1, represented by the x-axis, for the case where the perpendicular Hk (p-Hk) is equal to 14.5 kilo Oersted (kOe), shown by the line 9 and for the case where the perpendicular Hk of the layer 1 is equal to 13 kOe, shown by the line 11.

FIG. 4 shows the relevant portion of a spin torque transfer magnetic random access memory (STTMRAM) element 30, in accordance with an embodiment of the present invention.

FIG. 5 shows a top view 35 of the layer 21 and a side view 37 of the layer 21, in accordance with an embodiment of the present invention.

FIG. 6 shows the relevant magnetization fields of the layer 23, 22, 21, 24 and 25 of the element 30, in accordance with an embodiment of the present invention.

Figure 9:
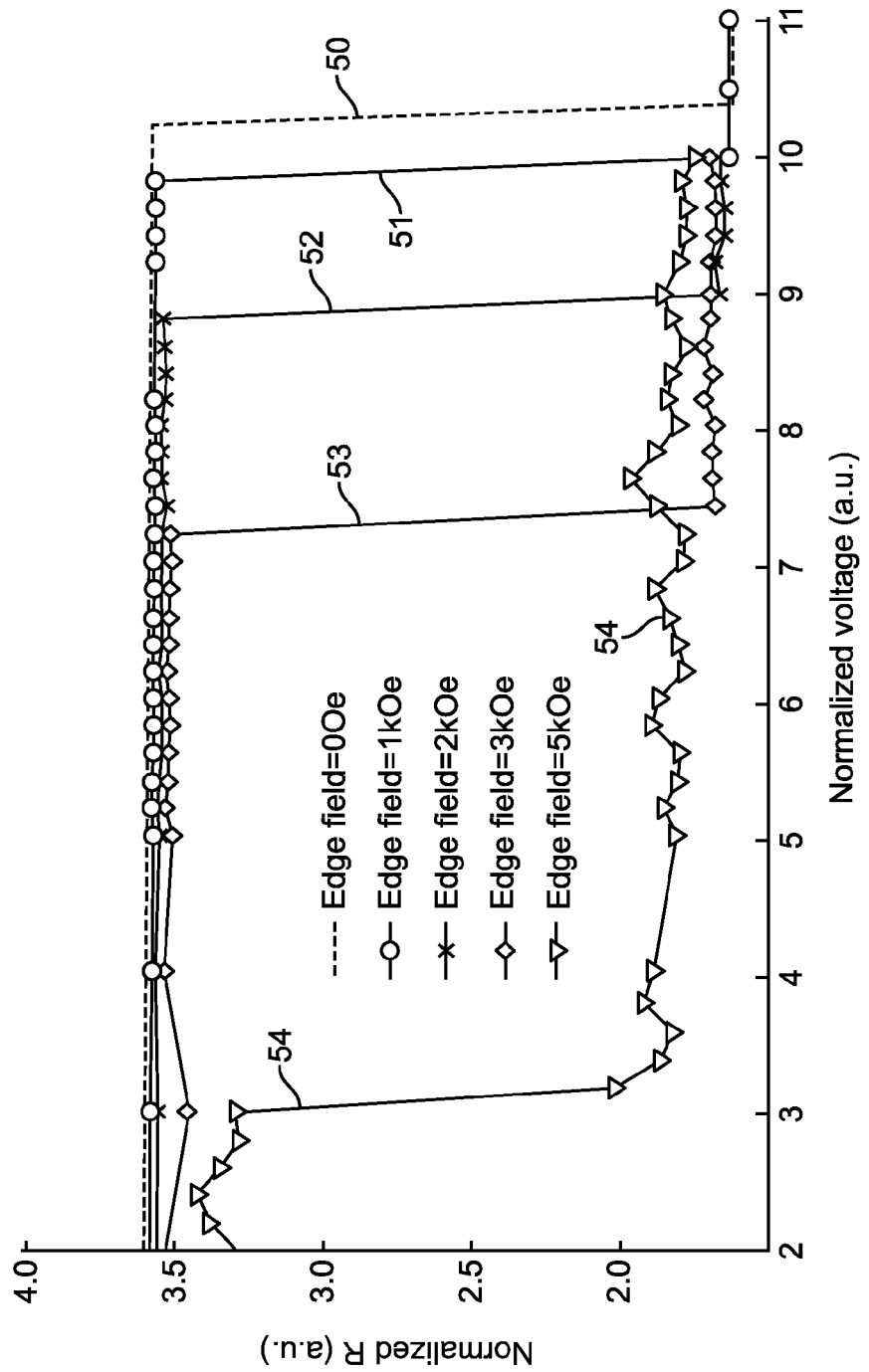

FIG. 9 shows a graph of the performance of the element 30 when various levels of edge field, including none, are applied to the layer 21 of the element 30.

Figure 10:
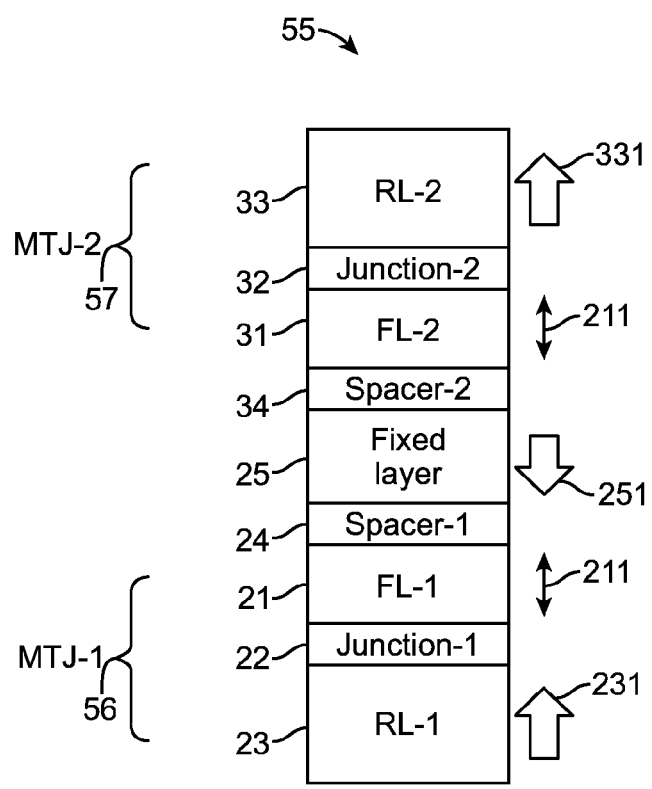

FIG. 10 shows the relevant portion of a spin torque transfer magnetic random access memory (STTMRAM) stack 55, in accordance with an embodiment of the present invention.

Figure 11:
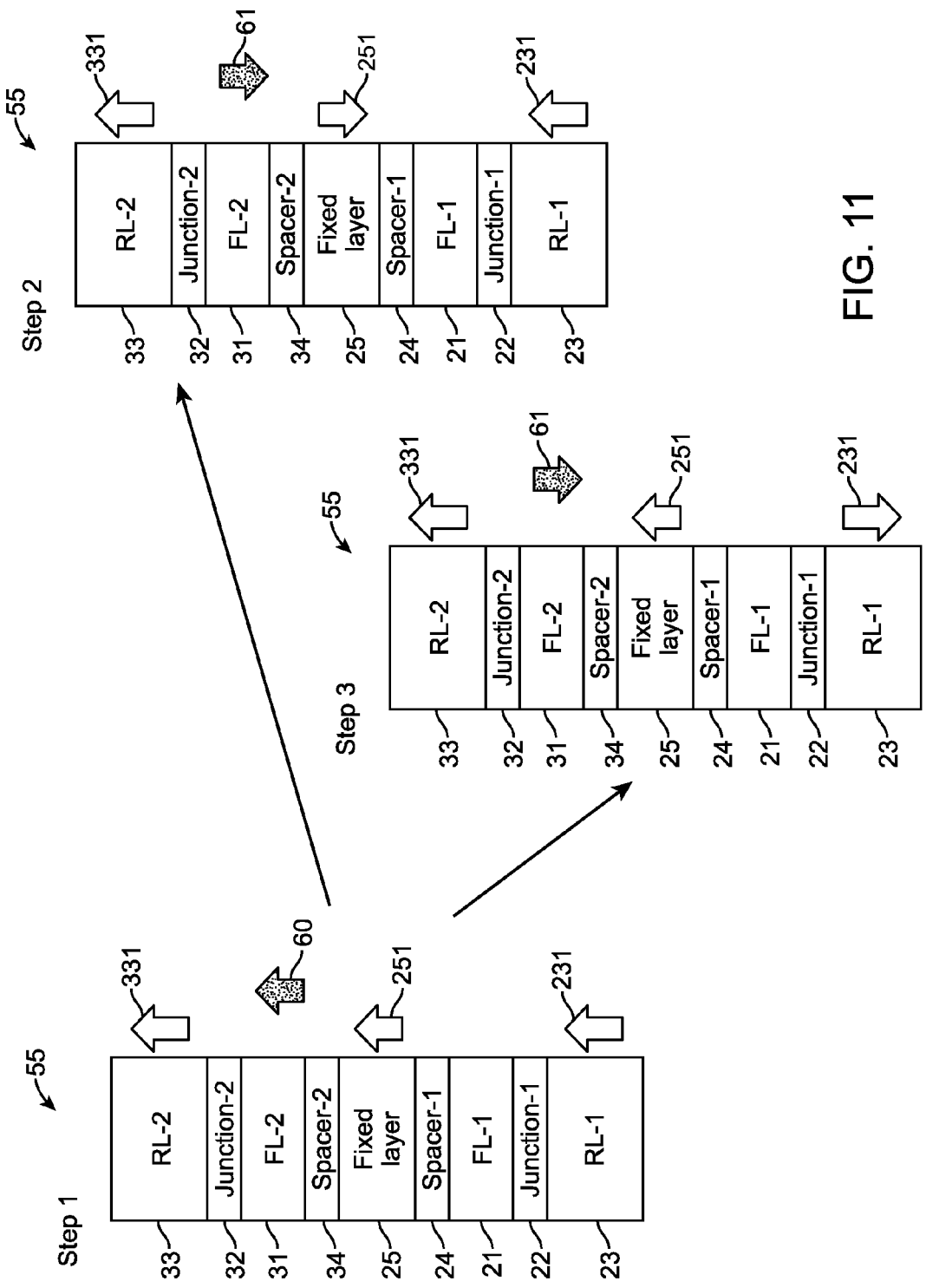

FIG. 11 shows the formation of the stack 55, in relevant part and accordance with a method of the present invention, as two steps.

Figure 12:
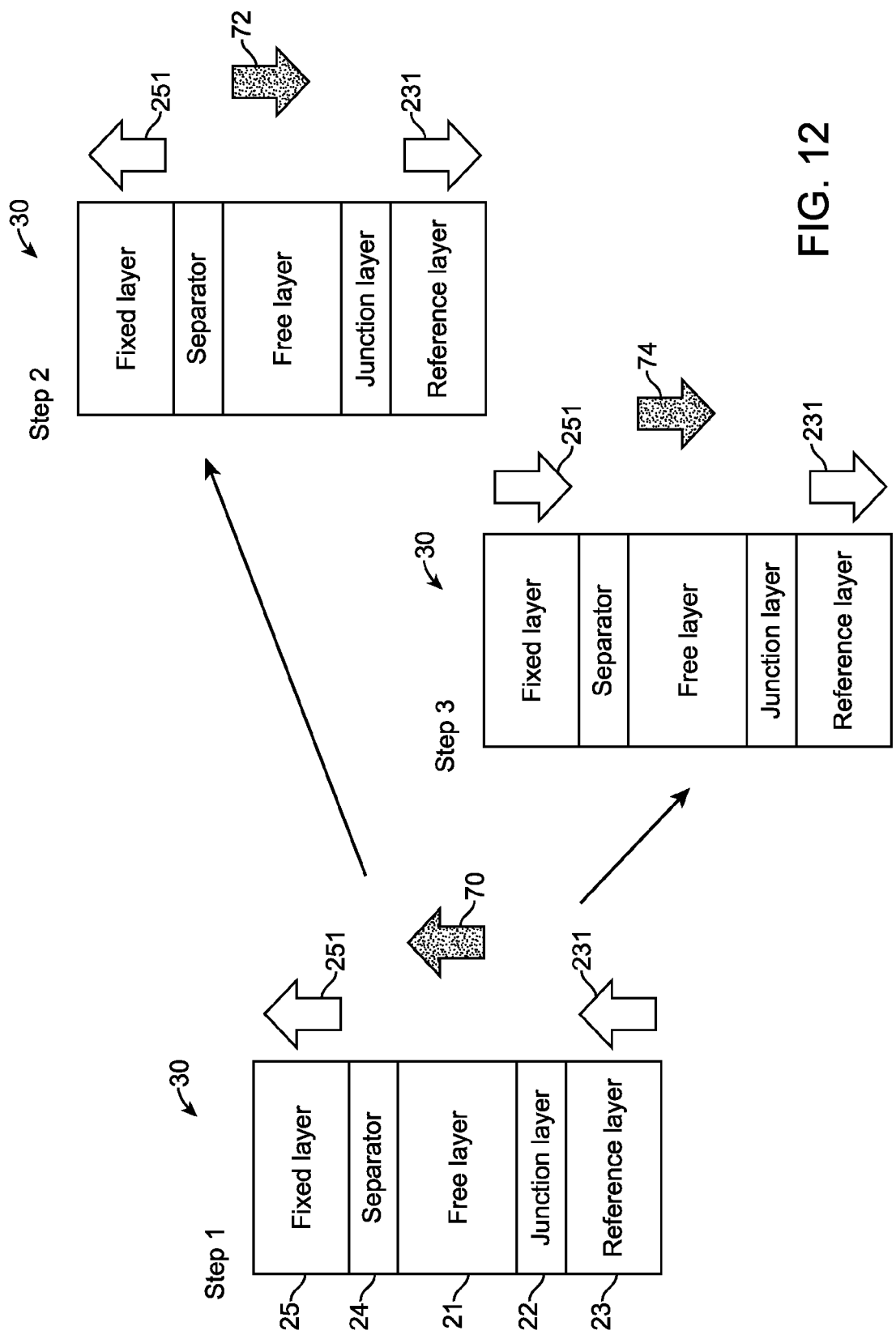

FIG. 12 shows the formation of the stack 30, in relevant part and accordance with another method of the present invention, as two steps.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a spin toque transfer magnetic random access memory (STTMRAM) element and a method of manufacturing the same is disclosed. Relevant layers of the STTMRAM element include a reference layer, formed on a substrate, with a perpendicular magnetic component that is fixed in one direction. A junction layer is formed on top of the reference layer and a free layer is formed on top of the junction layer and has a magnetic orientation, at substantially the center of it that is perpendicular relative to the substrate and parallel and switchable relative to the reference layer. Further, a spacer layer is formed on top of the free layer and a fixed layer is formed on top of the spacer layer, the fixed layer having a perpendicular magnetic component associated therewith that is fixed in a direction opposite to that of the reference layer. The free layer is capable of switching its magnetic orientation relative to the fixed layer when electrical current is applied to the STTMRAM element. The perpendicular magnetic components of the fixed layer and the reference layer substantially cancel each other and the free layer has a magnetization field at its edge that is in-plane relative to the substrate.

Figure 4:
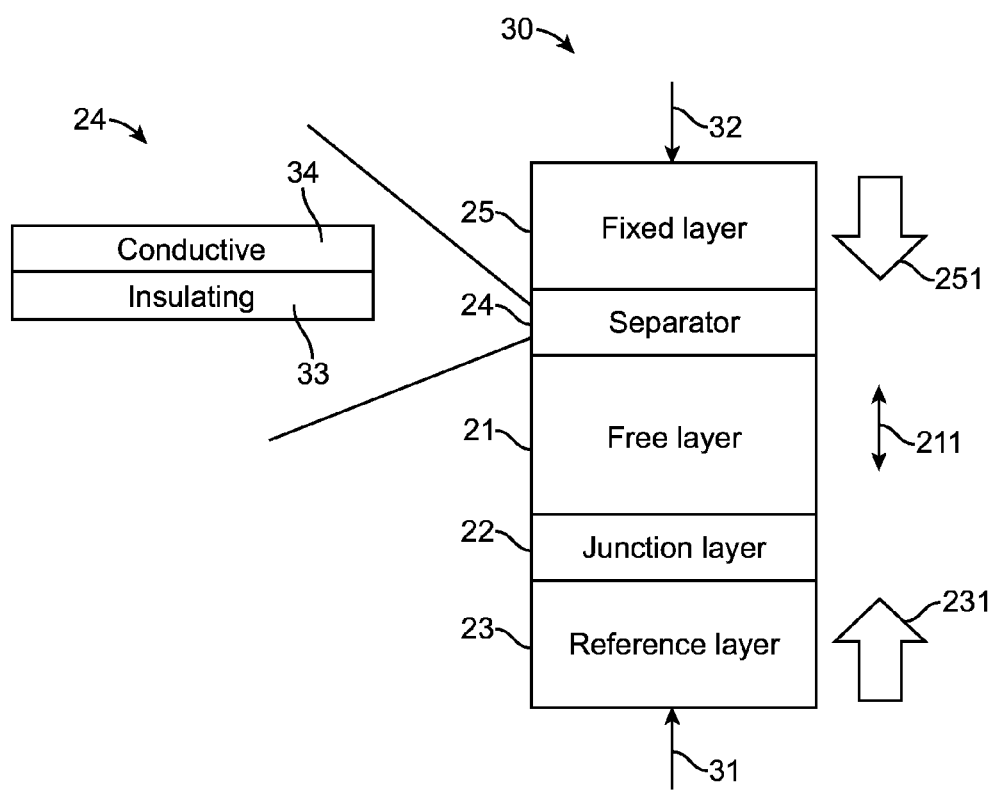

In an alternative embodiment, a stack is formed of multiple STTMRAM elements where each element is formed on top of another element allowing the stack to store more than one state. FIG. 4 shows the relevant portion of a spin torque transfer magnetic random access memory (STTMRAM) element 30, in accordance with an embodiment of the present invention. The STTMRAM element 30 is shown to include a reference layer 23, sometimes referred to as a "fixed layer", on top of which is formed a junction layer 22, sometimes referred to as a "barrier layer" or a "tunnel layer" or a "barrier tunnel layer" or a "tunnel barrier layer", on top of which is formed a free layer 21, sometimes referred to as a "switching layer", on top of which is formed a separator layer 24, sometimes referred to as a "spacer layer", on top of which is formed a fixed layer 25, sometimes referred to as a "reference layer". It is understood that other layers, not shown in FIG. 4, may be and are typically formed on top of the layer 25, below the layer 23 and/or in between any of the layers shown in FIG. 4.

The layer 23 is shown to have a magnetic moment (also known as magnetic orientation) in a direction shown by the arrow 231, the layer 21 is shown to have a magnetic moment in a direction shown by the arrow 211 and the layer 25 is shown to have a magnetic moment in a direction shown by the arrow 251. An electrical current is applied, either at 31 or at 32, to the element 30 during read and write operations. The element 30 is generally used to store digital information during write or program operations and this information is read during read operations. For these operations, various devices are coupled thereto that are not shown in FIG. 4. For a description of these devices and methods of reading from and writing to the element 30, the reader is directed to U.S. patent application Ser. No. 11/674,124, filed on Feb. 12, 2007, by Rajiv Yadav Ranjan, and entitled "Non-Uniform Switching Based Non-Volatile Magnetic Based Memory", the disclosures of which are incorporated herein by reference.

The element 30 has a perpendicular anisotropy in that the layer 21 has a magnetic moment that is perpendicular relative to that of the film on top of which the element 30 is formed. Similarly, the layers 25 and 23 have such a perpendicular anisotropy. The element 30 switches states and stores a digital value corresponding to the magnetic orientation of the layer 21 in that when this orientation is parallel to the magnetic orientation of the layer 23, the element 30 is in one state, generally referred to as "parallel", and when the orientation of the layer 21 is not parallel, or anti-parallel, relative to the orientation of the layer 23, the element 30 is in another state. These different states result from unique resistances across the MRAM stack. In this manner, the digital value of '1' or '0' is distinguished during read/write operations.

The layers 23 and 25 are made generally of material that is known in the art to be used for such fixed layer. Similarly, the layer 21 is made of material typically used by the industry for making a free layer, as is the layer 22 made of material known for making a tunnel layer. The layer 24, in some embodiments, is a multi-layer, made of at least one insulating layer 33, shown in the exploded view of the layer 24 at the left side of FIG. 4, and at least one conductive layer 34. While one of each of the insulating and conductive layers is shown, it is understood that 'n' number of such a configuration may comprise the layer 24, with 'n' being an integer value. However, the conductive and insulating layers alternate is such that no two conductive layers are adjacent to each other and no two insulating layers are adjacent to each other. The insulating layer being made of an insulating material, such as but not limited to any of the following: alumina ($Al_2O_3$), magnesium oxide (MgO), silicon dioxide ($SiO_2$), and oxide of other metallic material and the conductive layer being a conductive material, such as any of the following: ruthenium (Ru), tantalum (Ta), copper (Cu), silver (Ag), gold (Au) and any other metallic non-magnetic element or alloy. Thus, the conductive layer is non-magnetic. In alternative embodiments, the insulating layer 33 is formed on top of the conductive layer 34.

Figure 7:
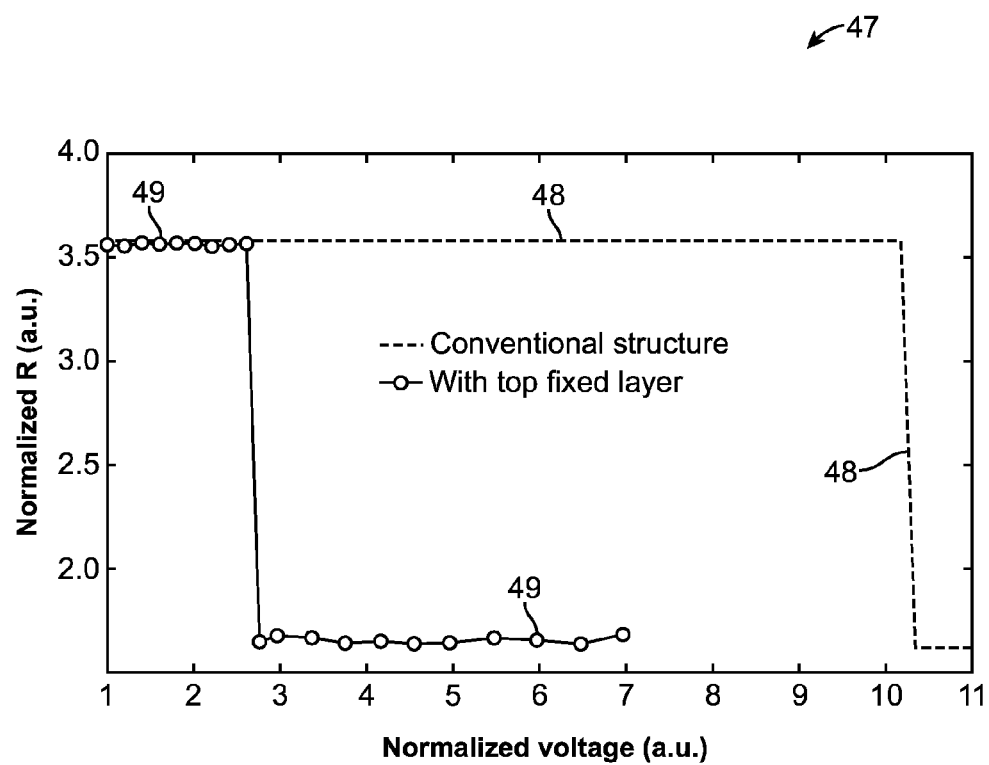
FIG. 7 shows a graph 47 of the performance of the element 30, in accordance with an embodiment of the present invention.

In some embodiments, the layer 24 is a single layer made of a non-magnetic material. The make-up of the layer 24, coupled with the configuration of the element 30, particularly using the layer 25 on top of the layer 24, as shown, cause the presence of magnetic fields at substantially the outer perimeter (edges) of the layer 21 with each such magnetic field having an in-plane magnetic orientation. These in-plane magnetic fields at the outer edge of the layer 21 effectively reduce the effect of the high perpendicular Hc, which, as previously discussed, prevents the free layer to readily switch magnetization states in prior art magnetic memories. Accordingly, switching between the states of the element 30 is eased and in this respect requires lower threshold voltage and current. As is shown in FIG. 7 herein, approximately 70% reduction in voltage is realized by the embodiment of FIG. 4 over that of prior art structures.

Figure 5:
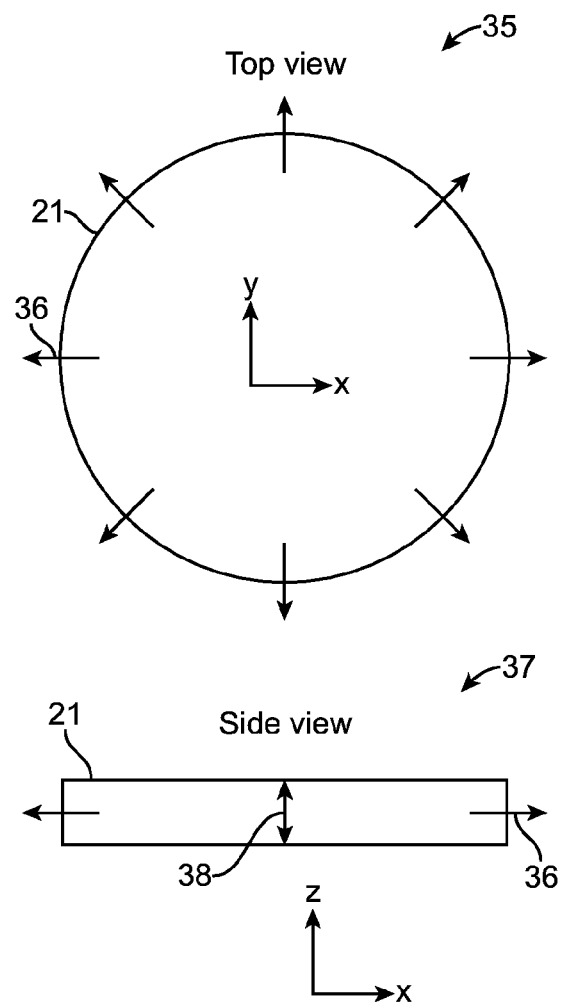

FIG. 5 shows a top view 35 of the layer 21 and a side view 37 of the layer 21, in accordance with an embodiment of the present invention. FIG. 5 shows a top view 35 of the layer 21 and a side view 37 of the layer 21. As shown, in-plane magnetization field 36, appearing at the edges of the layer 21 are present despite the perpendicular magnetization field 38, at substantially the center of the layer 21 that is switchable for storing purposes. The field 36 helps reduce the effect of high perpendicular Hc at the edge of the layer 21 thereby causing the layer 21 to switch with more ease.

Figure 6:
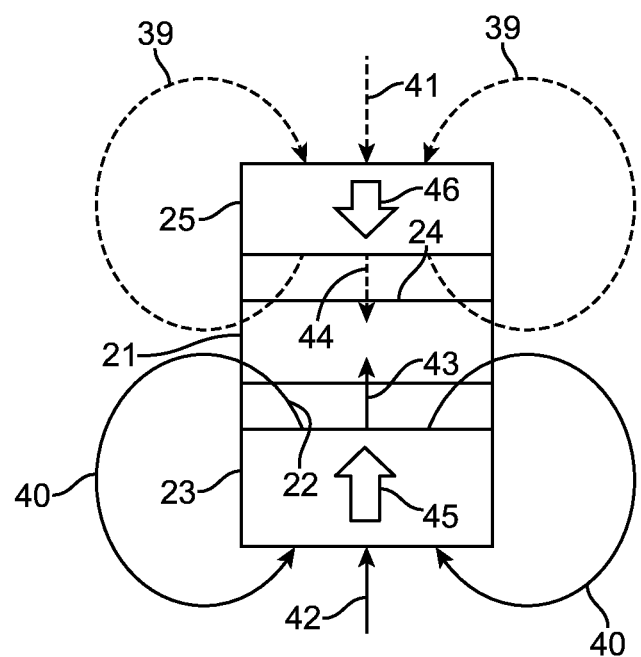

FIG. 6 shows the relevant magnetization fields of the layer 23, 22, 21, 24 and 25 of the element 30, in accordance with an embodiment of the present invention. The perpendicular magnetic fields, appearing substantially at the center, of the layers 23, 22, 24 and 25, are each shown in a direction consistent with the arrows 45, 43, 44 and 46, respectively. Magnetization directions of layer 23 and layer 25 are perpendicular relative to the plane of the substrate and opposite relative to each other and not necessarily required to follow the depicted directions in FIG. 6 and in alternative embodiments are in a reverse direction than that shown in FIG. 6.

The magnetization of the layer 25 creates the field shown by the arrow 41 and the magnetization of the layer 23 creates the field shown by the arrow 42. The layer 23 is also shown to have significant in-plane magnetic components or fields 40, at its edges, in a direction shown by the arrows associated with the fields 40. Similarly, the layer 25 is shown to have significant in-plane magnetic fields 39, at its edges, in a direction shown by the arrows of the fields 39. In the case of the layer 21, the magnetic field of the layer 25 imposes onto the layer 21 and is in large part perpendicular at substantially the center of the layer 21 and the layer 23, as shown by the arrow 44, which extends through the layer 24 such that the perpendicular magnetic field of the layer 24 is substantially the same as that of the layer 25. Similarly, the magnetic field of the layer 23 onto the layer 21 is in large part perpendicular at substantially the center of the layer 21, as shown by the arrow 43, which extends through the layer 22 such that the perpendicular magnetic field of the layer 22 is the same as that of the layer 23.

The perpendicular magnetic fields of the layers 25 and 23 essentially cancel each other while the in-plane magnetic field at the edges of the layer 21, fields 39 and 40, enhance each other and therefore reduce the effective Hc that would typically be present at the edges of prior art structures. Accordingly, not only does the process of switching states becomes easier and requires less voltage and current, switching is also advantageously substantially symmetrical.

Furthermore, by optimizing the spacing between the layers 25 and 21, the magnetic moment of the layers 23 and 25, the layer 21 can be made to switch at different voltages due to a difference in the magnitude of in-plane edge fields on the layer 21. For a greater understanding of the effect of the edge field on the switching voltage, a graph is shown and discussed relative to FIG. 7 and FIG. 8. By increasing the thickness of layer 24, layer 25 is further separated from the layer 21 thereby creating a weaker magnetic field in layer 21 than when the thickness of layer 24 is not so increased. To still fully compensate for the vertical field from layer 23 into the layer 21, magnetic moment of layer 25 can increase. While the vertical field is compensated, the edge in-plane field from the layer 25 onto layer 21 is lower than before as the spacing of layer 21 and layer 25 increases. Thus, with a lower edge in-plane field on layer 21, layer 21 would switch harder than before.

Figure 1:
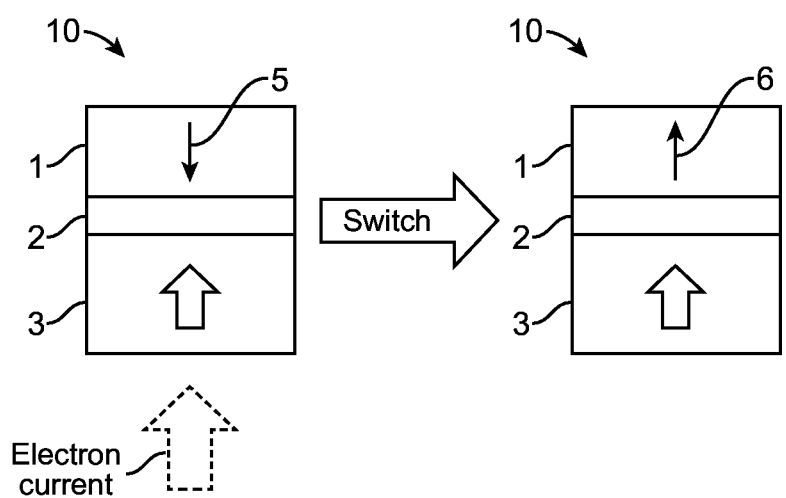
Figure 3:
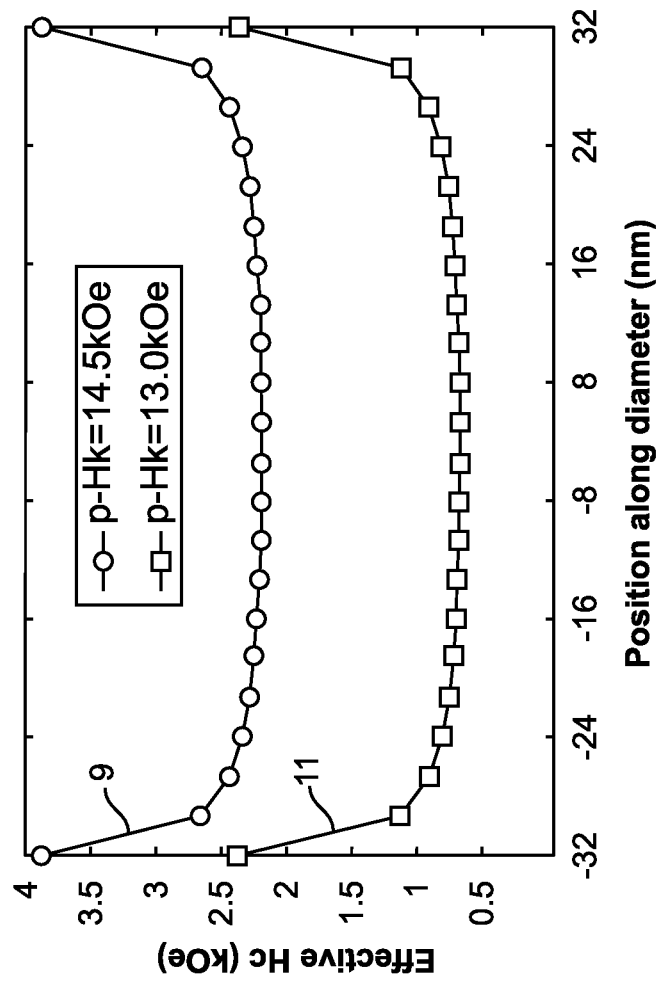
Figure 2:
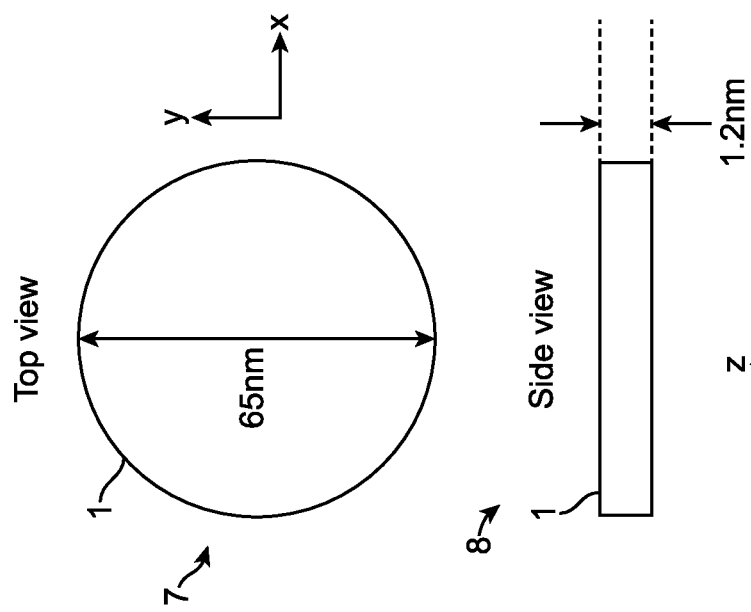

FIG. 7 shows a graph 47 of the performance of the element 30 vs. a conventional MRAM structure as in FIG. 1, in accordance with an embodiment of the present invention. Graph 47 is shown to have a y-axis indicative of the normalized resistance, in arbitrary unit (a.u.) in the y-axis vs. an x-axis indicative of the normalized switching voltage, in a.u., of the voltage required to switch the free layer in a MRAM structure from anti-parallel to reference layer, i.e. high resistance, state to parallel, i.e. low resistance, state, where the drop in the curves marked the switching voltage of the free layer. The dashed line shown at 48 is the performance of a conventional magnetic random access memory element as in FIG. 1 and the line, shown at 49, with circles thereon is the performance of the element 30. As shown by the graph 47, the element 30 exhibits far lower switching voltage than its counterpart structure. A reduction of more than 70% in the switching voltage is realized.

Figure 8:
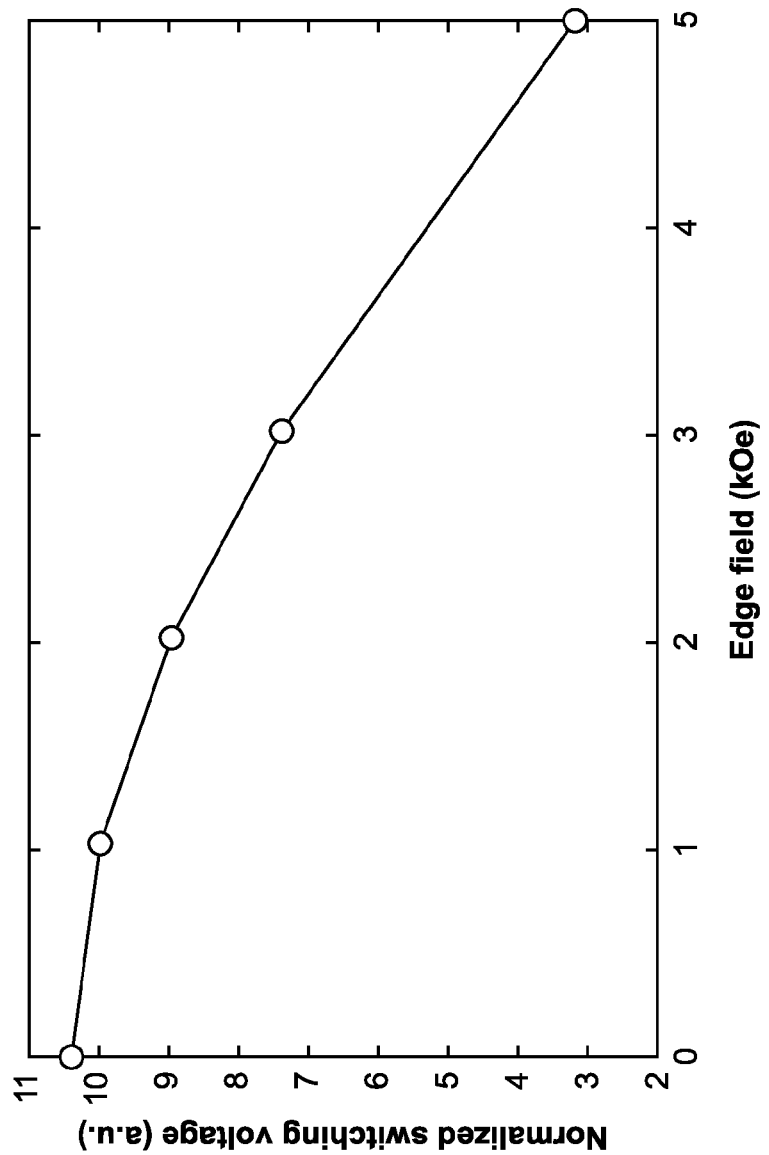
FIG. 8 shows a graph of the normalized switching voltage of the element 30 as the in-plane magnetic edge field of its layer 21 increases.

FIG. 8 shows a graph of the normalized switching voltage of the element 30 as the in-plane magnetic edge field of its layer 21 increases. The graph of FIG. 8 has a y-axis that represents the normalized switching voltage of the element 30 in a.u. and an x-axis that represents the in-plane edge magnetic field of the layer 21, in kOe. As shown, the switching voltage reduces faster at higher in-plane edge magnetic field of the element 30. For example, at the normalized switching voltage of 10, the edge field is approximately zero whereas at the normalized switching voltage of approximately 5.5, the edge field is approximately 4. Thus, by controlling the edge field, the layer 21 can be made to switch states at different voltages.

FIG. 9 shows a graph of the performance of the element 30 when various strengths of edge field, including none, are applied to the layer 21 of the element 30. The graph of FIG. 9 includes a y-axis representing the normalized resistance, in a.u., of the element 30 relative to the normalized voltage, in a.u., of the element 30, shown by the x-axis, when there is no in-plane edge field applied, shown at 50, and when an in-plane edge field of 1 kOe is applied, as shown at 51, and when an in-plane edge field of 2 kOe is applied, as shown at 52, and when an in-plane edge field of 3 kOe is applied, as shown at 53, and when an in-plane edge field of 5 kOe is applied, as shown at 54. As shown, with the applied in-plane edge field increasing from none to 5 kOe, the voltage required to switch the layer 21 advantageously decreases from 10.4 to 3.2, which is approximately a 70% reduction.

FIG. 10 shows the relevant portion of a spin torque transfer magnetic random access memory (STTMRAM) stack 55, in accordance with an embodiment of the present invention. The stack 55 is shown to include the layers of the element 30 and on top of the layer 25 thereof is shown formed a spacer layer 34 on top of which is shown formed free layer 31 on top of which is shown formed junction layer 32 on top of which is shown formed reference layer 33. The layers 21-23 form an MTJ 56 and the layers 31-33 form an MTJ 57. Thus, MTJ 56 and 57 are stacked. Because two MTJs form the stack 55, the stack 55 is capable of storing two states. It is understood that the stack 55 may employ any number of MTJs and clearly, the more MTJs employed, the greater the number of states that can be stored in the stack 55. Thus, the stack 55 is considered to be a multi-state element.

Similar to the layer 24, the layer 34 is non-magnetic, in one embodiment of the present invention, and is accordingly made of an insulating layer or a conductive layer. In other embodiments, the layer 34, again similar to the layer 24, is multi-layered and made of any number of alternating oxide and conductive layers. The layers 31-33 are made of material analogous to that of the layers 21-23, respectively. In some embodiments, the thicknesses of the layers 31-33 are analogous to those of the layers 21-23, respectively, and in alternative embodiments, the thicknesses of the layers 31-33 are different than that of the layers 21-23, respectively. The layers 23 and 33 have different magnetic moments in some embodiments, and similar magnetic moments in other embodiments. Different moments cause different fields in the respective free layers and thus different edge fields and different switching voltages associated with each of the free layers, even when the free layers are identical in material and/or thickness. The layers 24 and 34 each have a different thickness relative to the other. The effective in-plane edge magnetic field of the layer 21, as produced by the layers 23 and 25, is different than the effective in-plane edge magnetic field of the layer 31, which is produced by the layers 25 and 33. This is largely due to the requirement of each of the layers 21 and 31 having a unique current density to switch, as known to those skilled in the art. That is, briefly, the MTJs of the stack 55 cause it to be a multi-state element where each MTJ's unique switching current density results in a different state being programmed to from a multi-level cell. Accordingly, the effective in-plane magnetic edge field of each of the MTJs must also be at a different strength.

Layer 25 in FIG. 10 is a single magnetic layer in some embodiments and a magnetic multilayer structure with magnetic layers interleaved by non-magnetic layer in other embodiments. Such non-magnetic layer can be metallic, or metal oxide, or interlacing of both.

FIG. 11 shows the formation of the stack 55, in relevant part and accordance with a method of the present invention, as two steps. After the formation of the layers of the stack 55, field 60 is applied to the stack 55 to magnetize the layers 23, 33 and 25 such that the direction of magnetization at the center of each of these layers is substantially pointing in the same direction as the direction of magnetization at the center of the rest of these layers, as shown by the arrows 231, 331, and 251, respectively. Also, the magnetic orientation at the center of each of the layers 23 and 25 and 33 is parallel relative to that of the others. Field 60 has an orientation consistent with the direction of the arrow shown at field 60. This completes Step 1 but in this configuration, clearly, the magnetic fields at the center of the layers 25 and 23 do not cancel each other. Thus, next, at Step 2, field 61 is applied to the stack 55. The direction of the magnetic orientation of field 61 is consistent with the direction of the arrow shown at field 61, which is opposite to that of field 60. Field 61 is lower in strength than field 60 and only magnetizes the layer 25 to a direction that is opposite to that of the layers 23 and 33. In other embodiments, field 61, while still lower than field 60, only magnetizes the layers 23 and 33 such that these layers' magnetization orientation becomes opposite to that of the layer 25, which is shown at Step 3. Thus, after Step 1, either Step 2 is performed or Step 3 is performed. It is noted that the foregoing method of forming the stack 55 can also be applied to the element 30 when it is being manufactured.

In accordance with another method of forming the stack 55 and/or the element 30, the field 60 is applied while the layers of the stack/element are being formed, during the MTJ deposition and annealing, readily known in the art. A temperature of greater than 200 degrees Celsius during the annealing of the MTJ can be used during such a process.

FIG. 12 shows the formation of the stack 30, in relevant part and accordance with another method of the present invention, as two steps. After the formation of the layers of the stack 30, as described relative to FIG. 4, at step 1, field 70 is applied to the stack 30 to magnetize the layers 23 and 25 such that the direction of magnetization of each of these layers is substantially pointing in the same direction as shown by the arrows 231, and 251, respectively. At this point, the process either continues to Step 2 or to Step 3. Assuming Step 3 is performed next, field 72 is applied to the stack 30. The direction of the magnetic orientation of field 72 is consistent with the direction of the associated arrows, which is opposite to that of field 70. Field 72 is lower in strength than field 70 and in some embodiments only magnetizes the layer 23 in the direction shown and in other embodiments magnetizes the layer 25 in a direction substantially opposite to that of the layer 23.

Alternatively, after Step 1, Step 3 is performed in a manner analogous to Step 2 except that the layer 23 has a magnetization direction that is opposite to that which it took on at Step 1 but remains opposite to that of the layer 25 because the layer 25 is magnetized, in Step 3, in the same direction as that which it took on at Step 1. At step 3, field 74 is applied to the element 30 to effectuate the foregoing magnetizations. The direction of field 74, as shown, dictates the direction of magnetization of the layers 23 and 25, at Step 3.

In accordance with another method of forming the element 30, the field 70 is applied while the layers of the stack/element are being formed, during the MTJ deposition and annealing, readily known in the art. A temperature of greater than 200 degrees Celcuis during the annealing of the MTJ can be used during such a process. The fields 72 and 74 are applied to the element 30 after the formation of the latter.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A spin transfer torque magnetic random access memory (STTMRAM) element configured to store a state when electrical current is applied thereto comprising:
   a reference layer formed on a substrate with a plane, the reference layer and having a perpendicular magnetization associated therewith that is fixed in one direction;
   a junction layer formed on top of the reference layer;
   a free layer having a center and formed on top of the junction layer and having a magnetization at substantially the center of the free layer that is perpendicular relative to the plane of the substrate, the free layer being capable of changing states by switching its magnetization when electrical current is applied to the STTMRAM element;
   a spacer layer formed on top of the free layer; and
   a fixed layer formed on top of the spacer layer, the fixed layer having a perpendicular magnetization associated therewith that is fixed in a direction opposite to that of the reference layer, the magnetization of the free layer being parallel and switching relative to that of the reference layer, wherein an in-plane magnetic field is generated at an edge of the free layer by the fixed layer and the reference layer, the free layer further having associated therewith a coercively field that is smaller in the presence of the in-plane magnetic field.

2. The STTMRAM element, as recited in claim 1, wherein the spacer layer is made of a non-magnetic material.

3. The STTMRAM element, as recited in claim 1, wherein the spacer layer is multi-layered and made of 'n' number of a combination of an insulating layer and a conductive layer, wherein 'n' is an integer value.

4. The STTMRAM element, as recited in claim 3, wherein at least one of the insulating layers of the spacer layer is formed on top of the free layer and at least one of the conductive layers of the spacer layer is formed on top of the insulating layer.

5. The STTMRAM element, as recited in claim 3, wherein at least one of the conductive layers of the spacer layer is formed on top of the free layer and at least one of the insulating layers of the spacer layer is formed on top of the insulating layer.

6. The STTMRAM element, as recited in claim 3, wherein at least one of the insulating layers of the spacer layer is made of a material selected from a group consisting of: alumina ($Al_2O_3$), magnesium oxide (MgO), and silicon dioxide ($SiO_2$).

7. The STTMRAM element, as recited in claim 3, wherein at least one of the conductive layers is made of a metallic non-magnetic element or alloy.

8. The STTMRAM element, as recited in claim 3, wherein at least one of the conductive layers is made from a material selected from a group consisting of: ruthenium (Ru), tantalum (Ta), copper (Cu), silver (Ag), and gold (Au).

9. The STTMRAM element, as recited in claim 1, wherein the perpendicular magnetic component of the reference layer and the perpendicular magnetic component of the fixed layer are each substantially in a center of each respective layer and each layer has an in-plane edge magnetic field that is substantially at an edge thereof that collectively produce an in-plane edge magnetization field of the free layer.

* * * * *